(12) United States Patent
MacNamara et al.

(10) Patent No.: US 7,709,950 B2
(45) Date of Patent: May 4, 2010

(54) SILICON WAFER HAVING THROUGH-WAFER VIAS

(75) Inventors: Cormac MacNamara, Belfast (GB); Conor Brogan, Belfast (GB); Hiugh J. Griffin, Newtownabbey (GB); Robin Wilson, Belfast (GB)

(73) Assignee: Icemos Technology Ltd., Belfast (GB)

( * ) Notice: Subject to any disclaimer, the term of this patent is extended or adjusted under 35 U.S.C. 154(b) by 0 days.

(21) Appl. No.: 12/202,638

(22) Filed: Sep. 2, 2008

(65) Prior Publication Data

US 2008/0315368 A1    Dec. 25, 2008

Related U.S. Application Data

(62) Division of application No. 11/381,605, filed on May 4, 2006, now Pat. No. 7,553,764.

(60) Provisional application No. 60/677,510, filed on May 4, 2005.

(51) Int. Cl.
H01L 23/12 (2006.01)
H01L 23/48 (2006.01)

(52) U.S. Cl. ............ 257/704; 257/774; 257/E23.181

(58) Field of Classification Search ........... 257/774, 257/704, E23.181
See application file for complete search history.

(56) References Cited

U.S. PATENT DOCUMENTS

| | | | |
|---|---|---|---|
| 3,648,131 A | 3/1972 | Stuby | |
| 4,074,342 A * | 2/1978 | Honn et al. | 361/779 |
| 5,750,926 A * | 5/1998 | Schulman et al. | 174/564 |
| 5,814,889 A * | 9/1998 | Gaul | 257/773 |
| 5,998,292 A | 12/1999 | Black et al. | |
| 6,087,719 A * | 7/2000 | Tsunashima | 257/686 |
| 6,426,991 B1 | 7/2002 | Mattson et al. | |
| 6,720,233 B2 | 4/2004 | Muth | |
| 6,762,473 B1 | 7/2004 | Goushcha et al. | |
| 2004/0061238 A1 | 4/2004 | Sekine | |
| 2005/0073040 A1* | 4/2005 | Lee et al. | 257/698 |
| 2006/0027934 A1 | 2/2006 | Edelstein et al. | |
| 2006/0275946 A1 | 12/2006 | MacNamara et al. | |
| 2008/0099924 A1 | 5/2008 | MacNamara et al. | |

FOREIGN PATENT DOCUMENTS

| | | | |
|---|---|---|---|
| WO | 2005001941 A3 | 1/2005 | |
| WO | 2005031880 A1 | 4/2005 | |

\* cited by examiner

*Primary Examiner*—Nitin Parekh
(74) *Attorney, Agent, or Firm*—Panitch Schwarze Belisario & Nadel LLP

(57) ABSTRACT

A method of manufacturing a semiconductor device includes providing a semiconductor substrate having first and second main surfaces opposite to each other. A trench is formed in the semiconductor substrate at the first main surface. The trench extends to a first depth position in the semiconductor substrate. The trench is lined with the dielectric material. The trench is filled with a conductive material. An electrical component is electrically connected to the conductive material exposed at the first main surface. A cap is mounted to the first main surface. The cap encloses the electrical component and the electrical connection.

6 Claims, 7 Drawing Sheets

SILICON WAFER HAVING THROUGH-WAFER VIAS

CROSS REFERENCE TO RELATED APPLICATIONS

This application is a divisional application of U.S. patent application Ser. No. 11/381,605 filed on May 4, 2006, currently pending, entitled "Silicon Wafer Having Through-Wafer Vias," which claims priority to U.S. Provisional Patent Application No. 60/677,510 filed on May 4, 2005, entitled "Silicon Wafer Having Through-Wafer Vias."

BACKGROUND OF THE INVENTION

Embodiments of the present invention relate to a semiconductor device and a method for manufacturing the semiconductor device, and more particularly, to a semiconductor device having through-wafer conductive vias and a method of manufacturing a semiconductor device having through-wafer conductive vias.

Micro-electro-mechanical systems (MEMS) has led to the creation of a wide variety of small and fragile electrical components such as sensor technologies. Presently, these MEMS sensors are not typically compatible with standard integrated circuit (IC) packaging technologies because of their fragility. Some have considered going to wafer level packaging for such MEMS sensors, where the MEMS sensor is encapsulated as part of typical clean room processing by a bonding method such as using direct wafer bonding or anodic bonding of a glass or silicon protective cap over the MEMS sensor.

FIG. 1 shows one prior art method for mounting a MEMS sensor 90 to a silicon wafer or substrate 20 and enclosing the MEMS sensor 90 with a glass or silicon cap 80. As can be seen, an electrical lead 97 is run across the surface of the substrate 20 from the MEMS sensor or other electrical component 90. Routing the electrical connection through the cap 80 is not trivial and the interface 83 between the cap 80 and the electrical connector 97 often leads to an imperfect seal or problems with conductivity of the electrical connector.

It is desirable to provide a semiconductor device having through-wafer conductive vias for connecting to an electrical component such as a MEMS sensor from beneath the semiconductor substrate. It is also desirable to form the through-wafer conductive vias using the semiconductor substrate material itself so as to minimize a fill process.

BRIEF SUMMARY OF THE INVENTION

Briefly stated, an embodiment of the present invention comprises a method of manufacturing a semiconductor device. To begin the process, a semiconductor substrate having first and second main surfaces opposite to each other is provided. At least one trench is formed in the semiconductor substrate at the first main surface. The at least one trench extends to a first depth position in the semiconductor substrate. The at least one trench is lined with a dielectric material. The at least one trench is filled with a conductive material. An electrical component is electrically connected to the conductive material exposed at the first main surface. A cap is mounted to the first main surface. The cap encloses at least a portion of the electrical component and the electrical connection between the electrical component and the conductive material.

Another embodiment of the present invention comprises a semiconductor device. The semiconductor device includes a semiconductor substrate having first and second main surfaces opposite to each other. The semiconductor device also includes at least one conductive via extending from the first main surface through the semiconductor substrate to the second main surface. A dielectric lining encloses the at least one conductive via through the semiconductor substrate, and the at least one conductive via is electrically isolated from the semiconductor substrate by the dielectric liner. The semiconductor device further includes an electrical component electrically connected to the at least one conductive via at the first main surface and a cap sealed to the first main surface. The cap encloses at least a portion of the electrical component and the electrical connection between the electrical component and the at least one conductive via.

Another embodiment of the present invention comprises a method of manufacturing a semiconductor device. To begin the process, a semiconductor substrate having first and second main surfaces opposite to each other is provided. At least one trench is formed in the first main surface. The at least one trench extends to a first depth position in the semiconductor substrate. The at least one trench defines a perimeter boundary around a portion of the semiconductor substrate. The portion of the semiconductor substrate bounded by the at least one trench forms a conductive via. The at least one trench is lined with a dielectric material. The at least one trench is filled with one of an insulating material and a semi-insulating material. An electrical component is electrically connected to the conductive via at the first main surface. A cap is mounted to the first main surface. The cap encloses at least a portion of the electrical component and the electrical connection between the electrical component and the conductive via.

Another embodiment of the present invention comprises a semiconductor device. The semiconductor device includes a semiconductor substrate having first and second main surfaces opposite to each other. The semiconductor device also includes at least one conductive via extending from the first main surface through the semiconductor substrate to the second main surface. The at least one conductive via is formed from a portion of the semiconductor substrate. The semiconductor device also includes a dielectric lining surrounding the at least one conductive via through the semiconductor substrate. The at least one conductive via is electrically isolated from the semiconductor substrate by the dielectric lining. The semiconductor device also includes an electrical component electrically connected to the at least one conductive via at the first main surface and a cap sealed to the first main surface. The cap encloses at least a portion of the electrical component and the electrical connection between the electrical component and the at least one conductive via.

BRIEF DESCRIPTION OF THE SEVERAL VIEWS OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
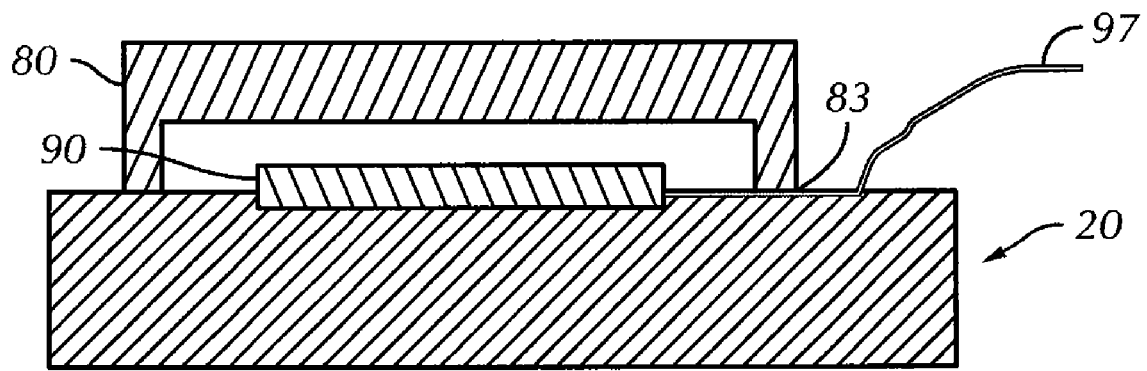
FIG. 1 is a side elevational cross sectional view of a prior art encapsulated electrical component on a semiconductor substrate.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a" as used in the claims and in the corresponding portion of the specification, means "at least one."

As used herein, reference to conductivity is for convenience only. However, those skilled in the art known that a P-type conductivity can be switched with an N-type conductivity and that the device would still function correctly. Therefore, where used herein, reference to N or P can also mean that either N or P and that P and N can be substituted therefor.

FIGS. 2-9 generally show a process of manufacturing a semiconductor device in accordance with a first preferred embodiment of the present invention.

Figure 2:
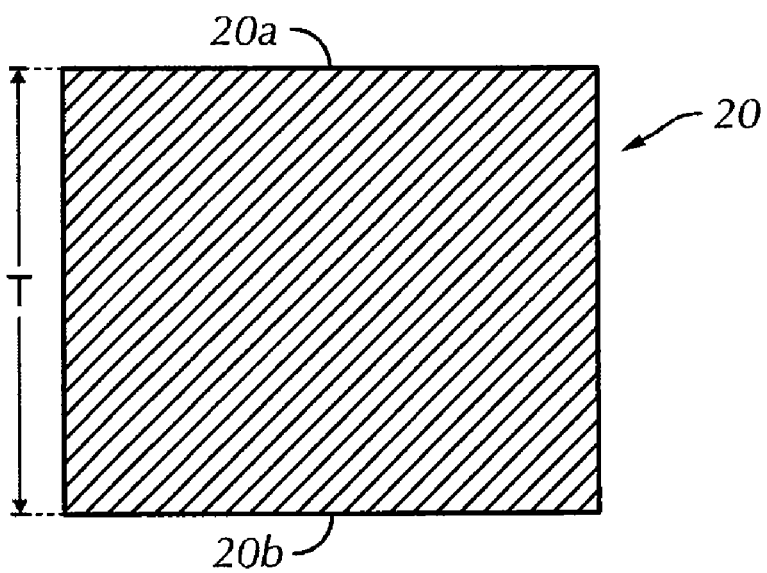
FIG. 2 is a partial sectional side elevational view of a semiconductor substrate used to form a semiconductor device in accordance with a first preferred embodiment of the present invention.

Referring to FIG. 2, there is shown an elevational view of a semiconductor substrate or wafer 20. The semiconductor substrate 20 can be undoped, lightly doped or heavily doped if desired. Preferably, the semiconductor substrate 20 is heavily doped. The semiconductor substrate 20 has a first main surface 20a, a second main surface 20b and a thickness T.

Figure 3:
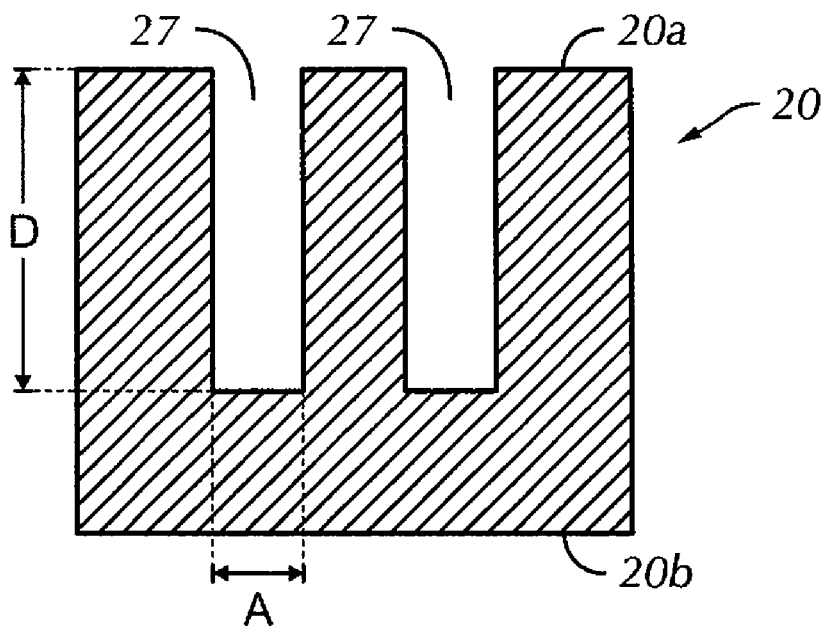
FIG. 3 is a partial sectional side elevational sectional view of the semiconductor substrate of FIG. 1 after a trenching step.
Figure 4:
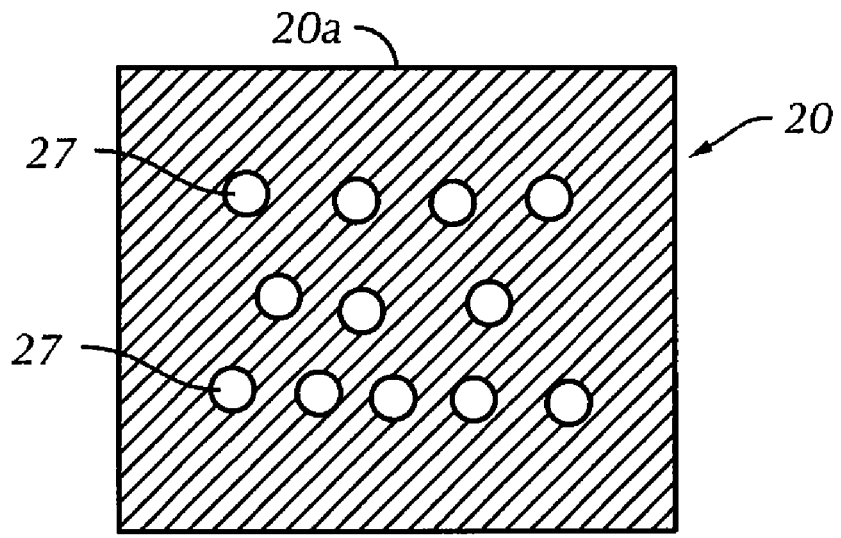
FIG. 4 is a partial sectional top plan view of the semiconductor substrate of FIG. 3.

Referring to FIG. 3, using techniques known in the art, the first main surface 20a of the semiconductor substrate 20 is etched to a first depth position D, but preferably, not all of the way through the semiconductor substrate 20. The etching process creates a trench 27 generally having a width A in the semiconductor substrate 20. The etching process can be a chemical etch, a plasma etch, a Reactive Ion Etch (RIE) and the like. The trench 27 can also be formed utilizing micro-electro-mechanical systems (MEMS) technology to "machine" the semiconductor substrate 20. A plurality of trenches 27 may be formed in the semiconductor substrate 20 at spaced locations in a desired pattern depending on how many electrical connections are desired for a particular electrical component 90. FIG. 4 shows a partial sectional top plan view of the semiconductor substrate 20 after a plurality of trenches 27 have been formed therein.

Figure 5:
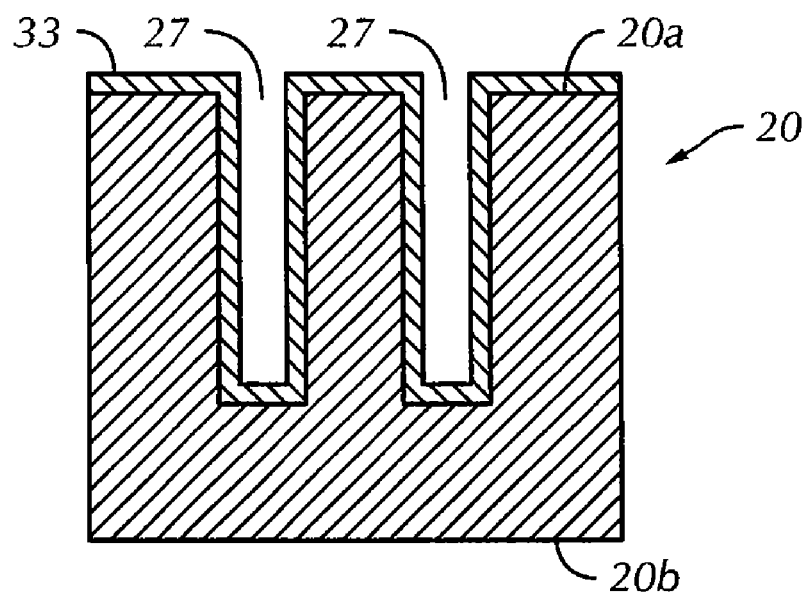
FIG. 5 is a partial sectional side elevational view of the semiconductor substrate of FIG. 3 after a dielectric lining step.

FIG. 5 shows that at least a portion of the first main surface 20a surrounding the trenches 27 and the side surfaces and bottoms of the trenches 27 themselves are lined with a dielectric material 33. Preferably, the entire first main surface 20a and all of the trenches 27 are lined with the dielectric material 33. The dielectric material may be deposited using a low pressure (LP) chemical vapor deposition (CVD) Tetraethylorthosilicate (TEOS) or a spun-on-glass (SOG) deposition technique or any other oxide deposition technique as is known in the art. In the preferred embodiments, the dielectric material is an oxide material but other dielectric materials could be used if desired.

Figure 6:
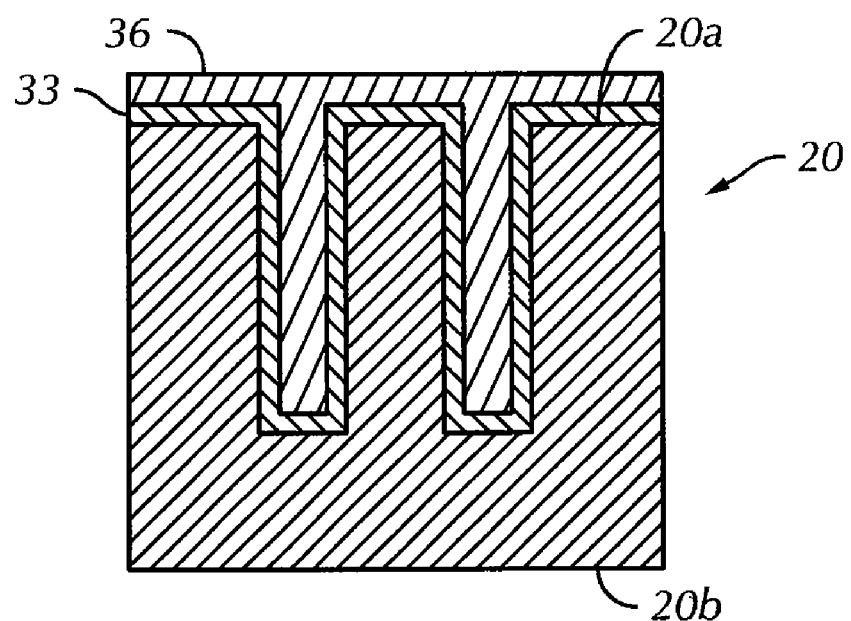
FIG. 6 is a partial sectional side elevational view of the semiconductor substrate of FIG. 5 after a trench filling step.

FIG. 6 shows that the trenches 27 are then filled with a conductive material 36 such as undoped polysilicon (poly), doped poly or a metal. Preferably, the trenches 27 are completely filled using a highly doped poly so that the resulting path defined by the fill material is highly conductive. As mentioned above, the poly may be N doped or P doped. Further, the poly may be deposited as in-situ doped poly or may be deposited as undoped poly and subsequently diffused with Phosphorous or Boron to achieve a high conductivity in the poly.

Figure 7:
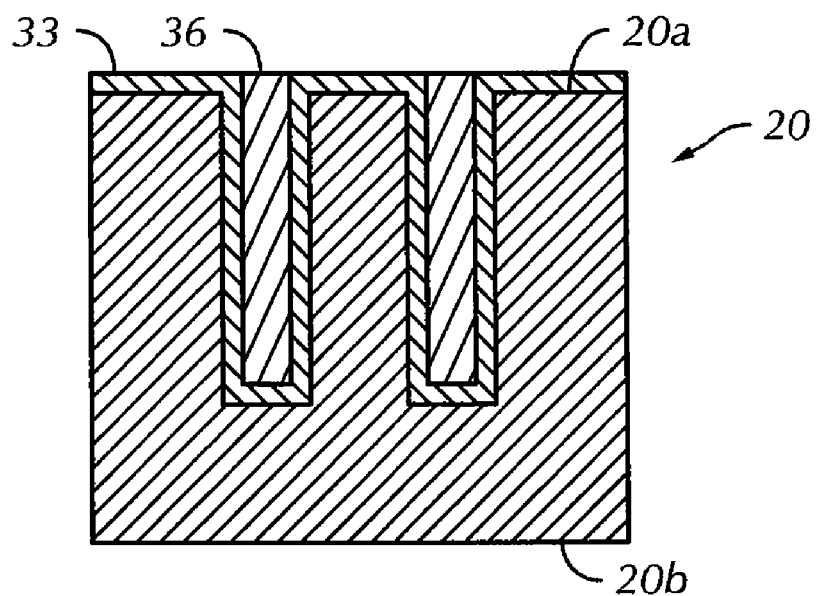
FIG. 7 is a partial sectional side elevational view of the semiconductor substrate of FIG. 6 after planarizing a first side.

FIG. 7 shows the semiconductor substrate 20 after the first surface 20a has been planarized to expose the dielectric material 33 surrounding the trenches 27. The planarizing may be performed using chemical mechanical polishing (CMP) or any other suitable planarization technique.

Figure 8:
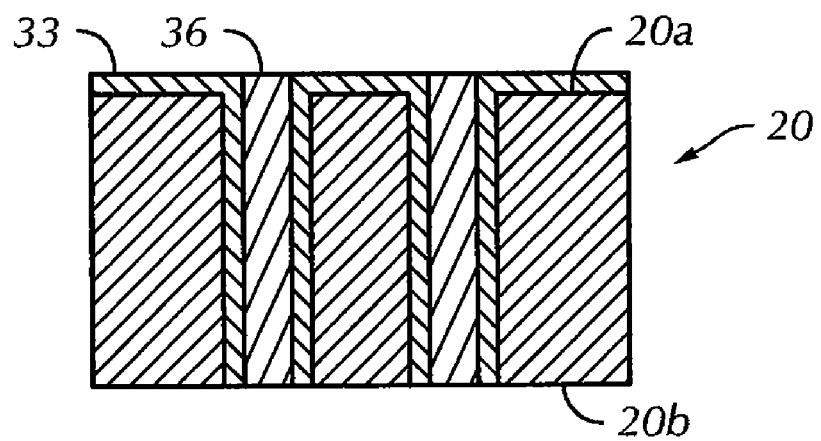
FIG. 8 is a partial sectional side elevational view of the semiconductor of FIG. 7 after planarizing a second side.

FIG. 8 shows the semiconductor substrate 20 after the second surface 20b has been planarized using a similar technique to expose the conductive material 36 at the second main surface 20b. The planarization of the second main surface 20b may be left for planarization by an intermediate manufacturer after other processing has been completed. For example, the base substrate 20 having conductive material 36 that forms conductive vias may be provided to an intermediate manufacturer for addition of an electrical component 90 and cap 80 prior to packaging the fabricated device.

Figure 9:
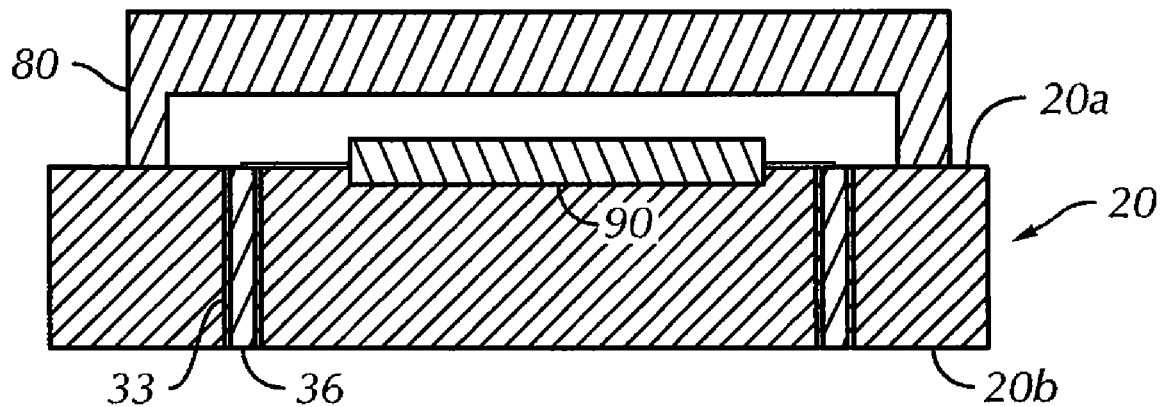
FIG. 9 is a partial sectional side elevational view of a formed semiconductor device in accordance with the first preferred embodiment.

FIG. 9 shows that an electrical component 90 has been mounted to the first surface 20a of the semiconductor substrate 20 and that the electrical component 90 has been electrically connected to the conductive material 36 exposed at the first main surface 20a. The electrical component 90 may be a sensor device such as an accelerometer, a gyroscope, a rate sensor, a pressure sensor, a resonator, a temperature sensor and an optical sensor or any other sensor or device. The electrical component 90 may be any technology that requires mounting on a silicon substrate as would be known in the art. A cap 80 has been mounted to the first surface 20a of the silicon substrate so as to enclose at least a portion of the electrical component 90 and the electrical connections between the electrical component 90 and the conductive material 36. The cap 80 may be silicon, polymeric, ceramic, glass, metal and the like or any other suitable material. Preferably, the cap 80 completely encloses the electrical component 90 and the electrical connections between the electrical component 90 and the conductive material 36. The cap 80 may be bonded to the silicon substrate 20 using either direct wafer bonding or anodic bonding in order to provide a tight seal.

FIG. 9 shows a semiconductor device including the semiconductor substrate 20, at least one conductive via 36 extending from the first main surface 20a through the semiconductor substrate 20 to the second main surface 20b and a dielectric lining 33 surrounding the at least one conductive via 36 through the semiconductor substrate 20. The conductive via 36 is electrically isolated from the semiconductor substrate 20 by the dielectric liner 33. The electrical component 90 is electrically connected to the conductive via 36 at the first main surface 20a. The cap 80 is sealed to the first main surface 20a and encloses at least a portion of the electrical component 90 and the electrical connection between the electrical component 90 and the conductive via 36.

Preferably, the electrical component 90, such as a MEMS sensor, is completely contained within the cap 80 and the cap 80 is tightly sealed to the first main surface 20a. All interconnects to the electrical component 90 are made within or underneath the cap 80. The technique is suitable for use with silicon, polymeric, ceramic, glass or metal capping techniques and their equivalents.

The base substrate 20 can be fabricated with the through-wafer conductive vias 36 that are isolated from the substrate by dielectric liner 33 and then shipped to an intermediate manufacturer to add the electrical component 90 and metallization for leads. For example, an intermediate manufacturer may add the electrical component 90 and make electrical connections to the conductive vias 36 and then seal the cap 80 over the semiconductor substrate 20. The intermediate manufacturer can then planarize the second surface 20b of the substrate 20 and provide metallization for electrical connections and/or further packaging such as solder bumps or surface mount connections as is known in the art.

FIGS. 10-14 generally show a process for manufacturing a semiconductor device in accordance with a second preferred embodiment of the present invention.

Figure 10:
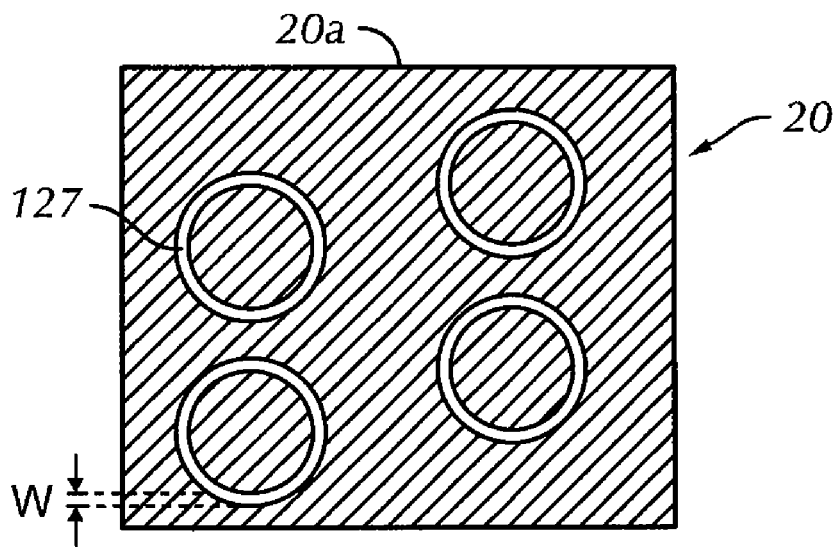
FIG. 10 is a partial sectional top plan view of a semiconductor substrate having a trench defining a perimeter boundary in accordance with a second preferred embodiment of the present invention.
Figure 14:
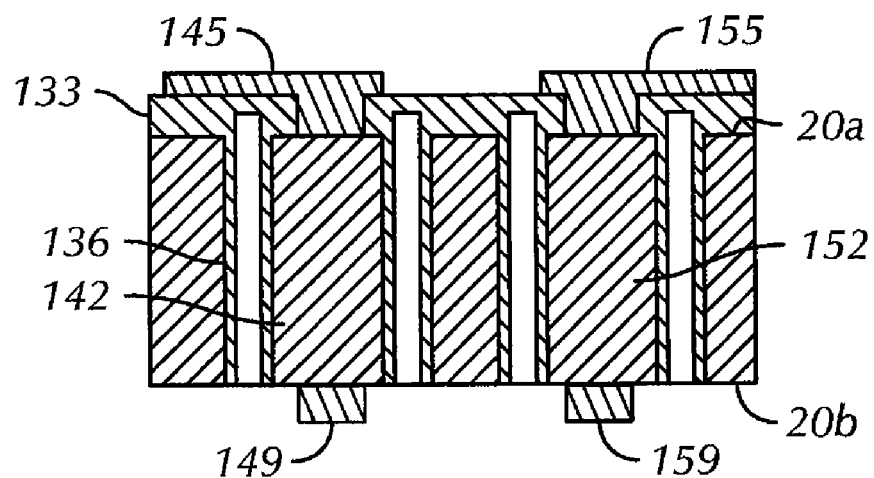
FIG. 14 is a partial sectional side elevational view of the semiconductor substrate of FIG. 13 after planarizing a second surface and metallizing conductive vias.

Referring to FIG. 10, there is shown a partial sectional top plan view of a semiconductor substrate 20 having circular or annular trenches 127 etched therein. Similar to the first preferred embodiment, the trenches 127 extend at least to a first depth position D in the semiconductor substrate 20. The trenches 127 define a "perimeter boundary" around a portion of the semiconductor substrate 20. The portion of the semiconductor substrate bounded by the trenches 127 form conductive vias 142, 152 (FIG. 14). The perimeter boundary may be circular, triangular, rectangular, elliptical, polygonal or may be any non-geometric or geometric and symmetric or asymmetric shape.

The width W of the trench 127 generally depends on the overall thickness T of the silicon substrate 20, the depth D of the trench 127 and a desired aspect ratio of the depth D versus the width W. It is desirable to minimize the width W of the trench 127 so that any fill material can be minimized. However, the width W needs to be a certain minimum width to achieve the depth D of the trench 127 that is desired. Furthermore, the width W is also selected based upon the amount of electrical isolation that is required between the conductive vias 142, 152 and the rest of the silicon substrate 20.

Figure 11:
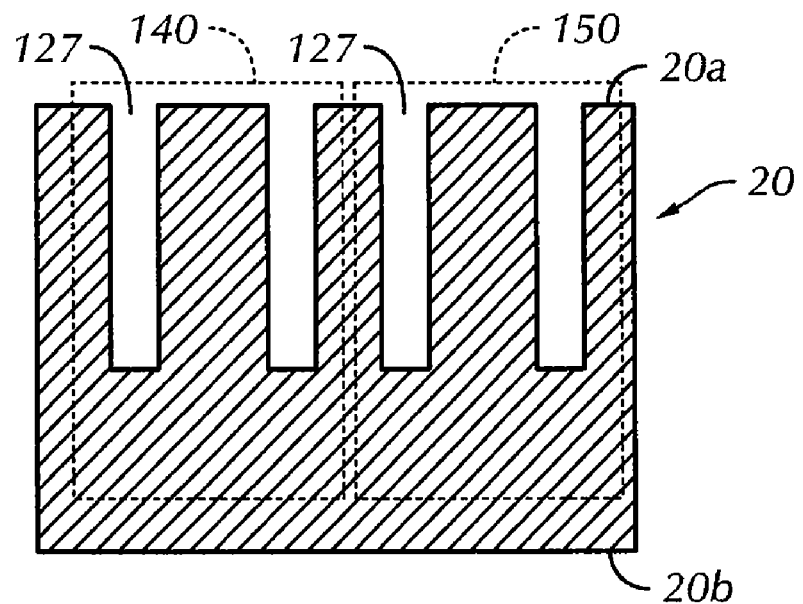
FIG. 11 is a partial sectional side elevational view of the semiconductor substrate of FIG. 10.

FIG. 11 shows a partial sectional side elevational view of the silicon substrate 20 having two annular trenches 127. Each trench 127 can be used to form a separate electrical via 142 isolated from another electrical via 152 (FIG. 14). In this case, area 140 encompasses a first via 142 and area 150 encompasses a second via 152 formed in the same silicon substrate 20. Of course, any number of vias 142, 152 may be formed in a silicon substrate 20 depending on the overall size of the silicon substrate 20, the width W of the trenches 127 and the overall size of each conductive vias 142, 152.

Figure 12:
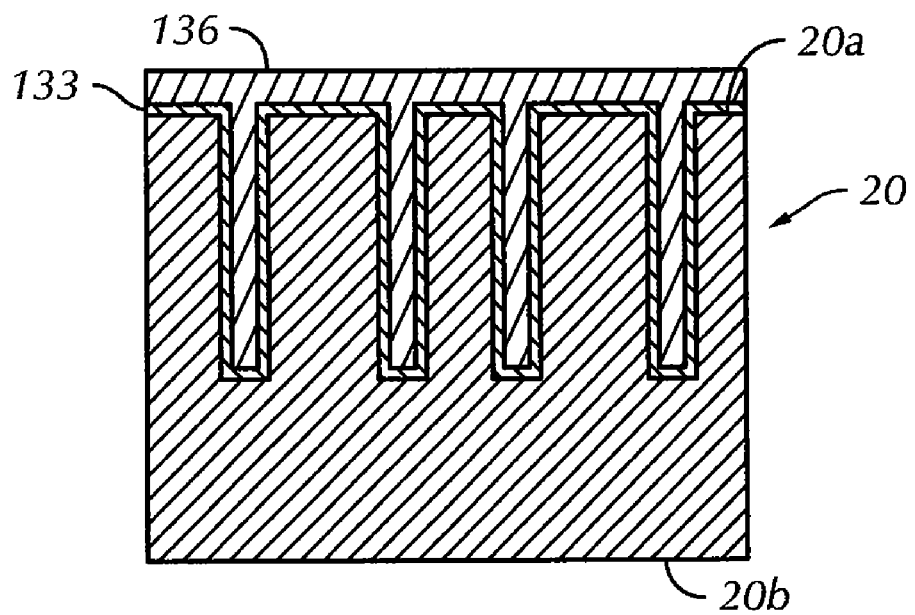
FIG. 12 is a partial sectional side elevational view of the semiconductor substrate of FIG. 11 after trench lining and filling.

FIG. 12 shows the silicon substrate 20 after a dielectric lining 133 has been applied to at least a portion of the first main surface 20a surrounding at least the trenches 127. The dielectric material 133 also lines the sidewalls and bottoms of the trenches 127. Further, the trenches 127 have been filled with one of an insulating material and a semi-insulating material 136. The fill material may be undoped poly, doped poly, doped oxide, undoped oxide, silicon nitride or semi-insulating polycrystalline silicon (SIPOS) or some other suitably insulating or semi-insulating material.

Figure 13:
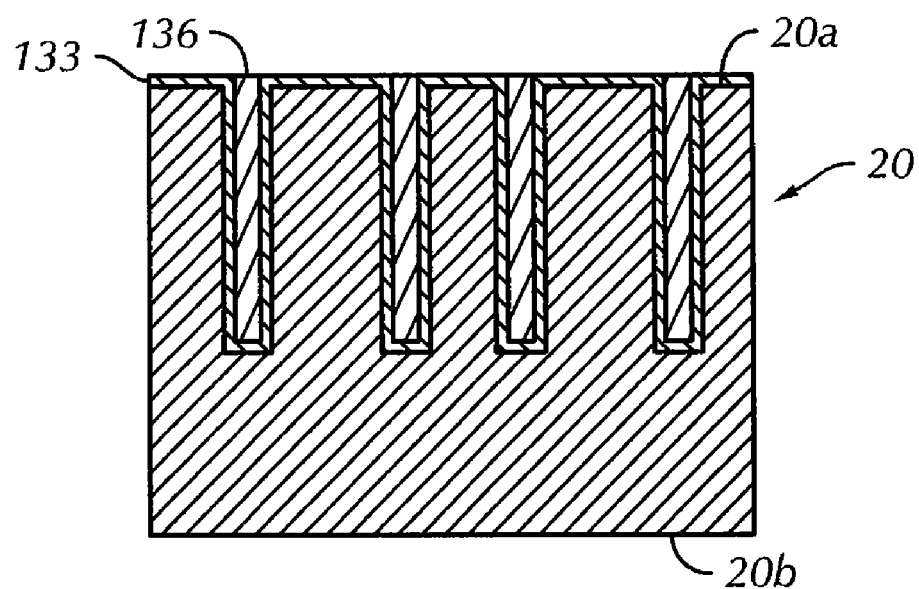
FIG. 13 is a partial sectional side elevational view of the semiconductor substrate of FIG. 12 after planarizing a first surface.

FIG. 13 shows the silicon substrate 20 after the first surface 20a has been planarized by using, for example, CMP.

FIG. 14 shows the semiconductor substrate 20 after contact windows have been opened up above conductive vias 142, 152 and metallization has been provided to form contacts at each end of the conductive vias 142, 152. For example, a metal contact 145 is formed at the first surface 20a of the silicon substrate 20 and is electrically coupled with the conductive via 142. Likewise, a metal contact 149 is disposed at the second surface 20b of the silicon substrate 20 after the second surface 20b has been planarized and is electrically coupled with the conductive via 142. Similarly, a metal contact 155 is formed at the first surface 20a of the silicon substrate 20 and is electrically coupled with the conductive via 152. Also, a metal contact 159 has been formed at the second surface 20b and is electrically coupled with the conductive via 152. An electrical component 90 can then be mounted in electrical connection with the contacts 145, 155 and a cap 80 can be sealed to the first main surface 20a of the silicon substrate 20 as described above in the first preferred embodiment. The contacts 149, 159 may be bumps as used in surface mount technology.

Alternatively, the conductive vias 142, 152 may be partially doped with one of Boron and Phosphorous or some other dopant. Likewise, the silicon substrate 20 may be doped or heavily doped prior to forming the trenches 127.

Other processing steps, as is known in the art, may be utilized without departing from the invention. For example, the trenches 27, 127 may be smoothed, if needed, using processing steps such as isotropic plasma etch or MEMS machining. Portions of the silicon substrate 20 or the entire device may have a sacrificial silicon dioxide layer grown thereon prior and then may be etched using a buffered oxide etch or a diluted hydrofluoric (HF) acid etch or the like to produce smooth surfaces and/or rounded corners thereby reducing residual stress and unwanted contaminants. Furthermore, additional insulation layers in addition to the dielectric layer may be added as desired. Furthermore, the conductive silicon substrate can be implanted and diffused to achieve a particular conductivity.

From the foregoing, it can be seen that embodiments of the present invention are directed to a semiconductor device and methods for manufacturing a semiconductor device. Moreover, it can be seen that embodiments of the present invention are directed to a semiconductor device having through-wafer conductive vias and methods for manufacturing a semiconductor device having through-wafer conductive vias. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A semiconductor device comprising:
 a semiconductor substrate having first and second main surfaces opposite to each other;
 at least one trench extending from the first main surface to a first depth position in the semiconductor substrate, the at least one trench defining a perimeter boundary around a portion of the semiconductor substrate;
 at least one conductive via extending from the first main surface through the semiconductor substrate to the second main surface, the at least one conductive via being formed from the portion of the semiconductor substrate bounded by the at least one trench forming a perimeter boundary thereof;
 a dielectric lining surrounding the at least one conductive via through the semiconductor substrate, the at least one conductive via being electrically isolated from the semiconductor substrate by the dielectric lining;
 an electrical component electrically connected to the at least one conductive via at the first main surface; and
 a cap sealed to the first main surface, the cap enclosing at least a portion of the electrical component and the electrical connection between the electrical component and the at least one conductive via.

2. The semiconductor device according to claim 1, wherein the at least one conductive via is at least partially doped with one of Boron and Phosphorous.

3. The semiconductor device according to claim 1, wherein the electrical component is one of an accelerometer, a gyroscope, a rate sensor, a pressure sensor, a resonator, a temperature sensor, and an optical sensor.

4. The semiconductor device according to claim 1, wherein the at least one trench is filled with at least one of undoped polysilicon, doped polysilicon, doped oxide, undoped oxide, silicon nitride and semi-insulating polycrystalline silicon (SIPOS).

5. The semiconductor device according to claim 1, wherein the perimeter boundary around the portion of the substrate is generally one of circular, triangular, rectangular, elliptical, polygonal and non-geometric/asymmetrical.

6. The semiconductor device according to claim 1, further comprising:
 a second dielectric lining disposed on at least a portion of the first main surface surrounding the at least one trench.

* * * * *